(12) United States Patent
Choi et al.

(10) Patent No.: US 8,692,138 B2
(45) Date of Patent: Apr. 8, 2014

(54) MOLD STRUCTURE FOR LIGHT-EMITTING DIODE PACKAGE

(75) Inventors: Sun Choi, Seoul (KR); Jong-Jin Park, Daejeon (KR)

(73) Assignee: Samsung Elecronics Co., Ltd., Suwon-Si (KR)

( * ) Notice: Subject to any disclaimer, the term of this patent is extended or adjusted under 35 U.S.C. 154(b) by 155 days.

(21) Appl. No.: 13/216,913

(22) Filed: Aug. 24, 2011

(65) Prior Publication Data

US 2012/0186848 A1    Jul. 26, 2012

(30) Foreign Application Priority Data

Jan. 20, 2011    (KR) ........................ 10-2011-0005981

(51) Int. Cl.
*H01L 23/48*    (2006.01)

(52) U.S. Cl.
USPC .............................. 174/533; 257/99; 257/676

(58) Field of Classification Search
USPC ..................... 174/521, 528, 533; 257/99, 676
See application file for complete search history.

(56) References Cited

U.S. PATENT DOCUMENTS

| | | | |
|---|---|---|---|
| 5,647,124 A * | 7/1997 | Chan et al. ...................... | 29/840 |
| 7,635,915 B2 * | 12/2009 | Xie et al. ...................... | 257/692 |
| 2003/0205800 A1 * | 11/2003 | Kim et al. ...................... | 257/684 |
| 2009/0057850 A1 * | 3/2009 | Moy et al. ...................... | 257/666 |

FOREIGN PATENT DOCUMENTS

| | | |
|---|---|---|
| KR | 10-0764449 B1 | 9/2007 |
| KR | 10-2009-0022350 A | 3/2009 |
| KR | 10-2009-0102209 A | 9/2009 |

* cited by examiner

*Primary Examiner* — Hung Ngo
(74) *Attorney, Agent, or Firm* — McDermott Will & Emery LLP

(57) ABSTRACT

A mold structure for a light-emitting diode (LED) package. The mold structure includes a notch, which is formed at at least an end portion of a package mold, in which a cavity is formed to mount a LED therein. Furthermore, an electrode lead, may be formed at at least an end portion of the package mold and may be closely attached to the package mold, and thus the overall size of a LED package may be reduced.

6 Claims, 4 Drawing Sheets

MOLD STRUCTURE FOR LIGHT-EMITTING DIODE PACKAGE

CROSS-REFERENCE TO RELATED APPLICATIONS

This application claims the benefit of Korean Patent Application No. 10-2011-0005981, filed on Jan. 20, 2011, in the Korean Intellectual Property Office, the disclosure of which is incorporated herein in its entirety by reference.

BACKGROUND

1. Field

The present disclosure relates to mold structures for a light-emitting diode (LED) package having a notch formed at at least an end of a package mold, such that a trimming die may be inserted thereto.

2. Description of the Related Art

A light-emitting diode (LED) is a semiconductor light-emitting device which converts electric signals into light. Compared to other light-emitting devices, a LED has relatively long lifespan and may be driven at a relatively low voltage. Recently, illumination devices, which employ white diodes having high brightness, have been replacing conventional light-emitting devices.

FIGS. 1A and 1B are diagrams showing the structure of a general LED package 10. Referring to FIGS. 1A and 1B, the general LED package 10 is fabricated by forming a package mold 11 in which a single cavity 12 is formed, mounting a LED 13, which is fabricated in advance, on a lead frame in the package mold 11, wire-bonding an electrode of the LED 13 and an electrode connecting unit of the package mold 11, and applying a phosphor and/or a light transmitting resin on a surface of the LED 13.

Along with the miniaturization of electronic devices employing LEDs, the sizes of LED packages are also being gradually reduced, and thus, higher precision is required for the fabrication of a package mold and a lead frame included therein. However, since there is a minimum required size in a conventional method of fabricating a package mold, there is a limit to the miniaturization of package molds by using the conventional method of fabricating a package mold. For example, as shown in FIG. 1A, an electrode lead 14 for supplying power to the general LED package 10 protrudes out of the package mold 11 in a bent shape. To form the electrode lead 14 in a bent shape, a separate bending die (not shown) is arranged at the region A and pressure is applied thereto. Therefore, it is necessary to secure a width d for arranging the separate bending die, which prevents the reduction in the size of an LED package. Furthermore, the region B1 is a portion at which a mold for a target package is fixed while a plurality of package molds are pressed in a mold for mass production, and is a portion to be cut later. For surface processing the region B1, a separate trimming die is arranged behind the package mold 11 as shown in FIG. 1B and pressure is applied thereto. However, the space may also interrupt the reduction in the size of a LED package.

SUMMARY

Provided are mold structures for a light-emitting diode (LED) package having a notch formed at at least an end portion of a package mold, such that a trimming die may be inserted thereto.

Provided are mold structures for a LED package having an electrode lead formed to be closely attached to two opposite ends of a die for a package.

Additional aspects will be set forth in part in the description which follows and, in part, will be apparent from the description, or may be learned by practice of the presented embodiments.

According to an aspect of the present invention, a mold structure for a light-emitting diode (LED) package, the mold structure includes a package mold, in which a cavity is formed to mount a LED therein; and a notch, which is formed at at least an end portion of the package mold.

The notch may be formed at a region at the opposite side of the cavity to which the LED of the package mold is mounted.

The notch may be a region to which a trimming die is inserted.

The mold structure may further include a protrusion, which is formed at a location corresponding to the notch, where the protruding height of the protrusion may be less than 0.4 mm.

The mold structure may further include an electrode lead, which is formed at at least an end portion of the package mold and is closely attached to the package mold.

A gap between the package mold and the electrode lead may be narrower than 0.4 mm.

The mold structure for a LED package may be a mold structure for a surface mount device (SMD) type LED package.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1A:
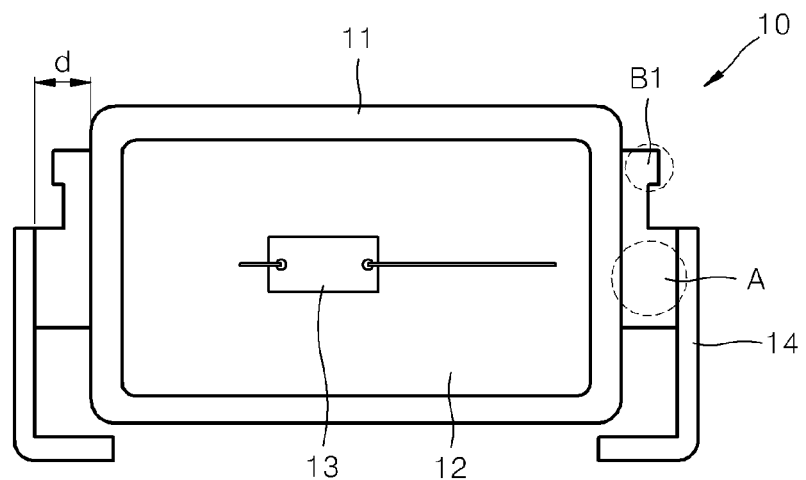
FIGS. 1A and 1B are diagrams showing the structure of a general LED package.
Figure 1B:
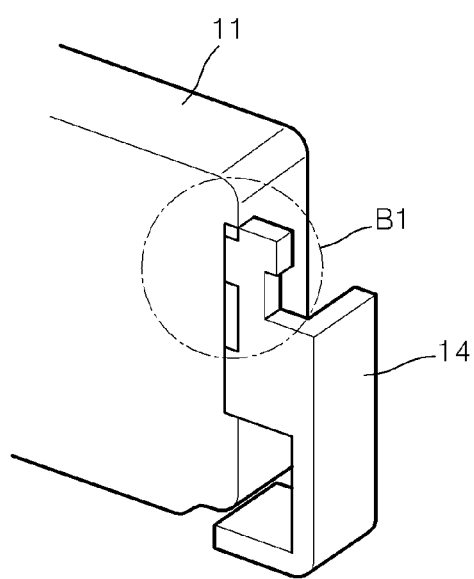

The present invention will now be described more fully with reference to the accompanying drawings, in which exemplary embodiments of the invention are shown. In the drawings, the thicknesses of layers and regions are exaggerated for clarity.

Figure 2A:
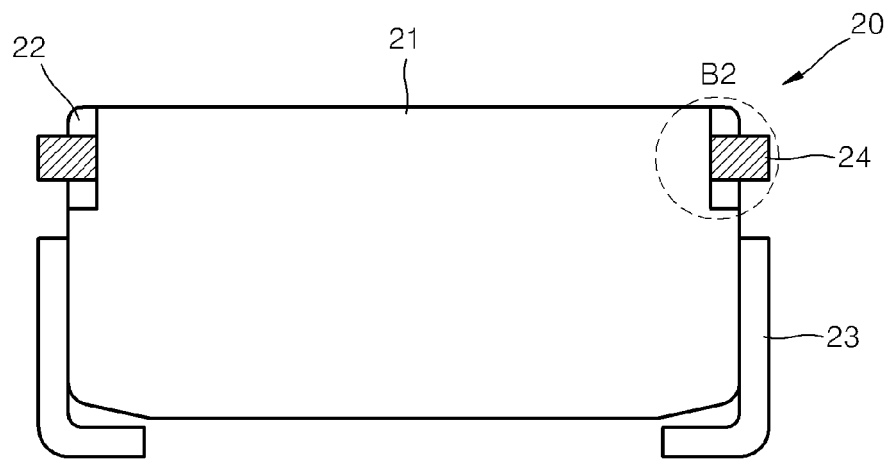
FIGS. 2A and 2B are schematic diagrams showing a mold structure for a light-emitting diode (LED) package, according to an embodiment of the present invention.
Figure 2B:
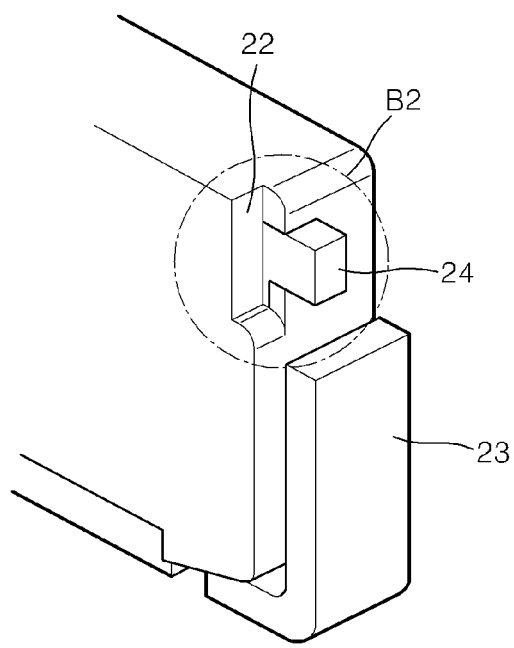

FIGS. 2A and 2B are schematic diagrams showing a mold structure for a light-emitting diode (LED) package 20, according to an embodiment of the present invention.

Referring to FIGS. 2A and 2B, in the mold structure for the LED package 20, according to an embodiment of the present invention, a package mold 21, in which a cavity for mounting a LED therein is formed, and a notch 22, which is formed at at least an end portion of the package mold 21 and to which a trimming die is to be inserted thereto. The notch 22 may be formed at a region B2 corresponding to a region in which a protrusion 24 is located.

Here, the protrusion 24 is a portion for fixing the mold structure for the LED package 20 while the mold structure for the LED package 20 is pressed to a mold during fabrication of the mold structure for the LED package 20, and is generally formed of a metal. The protrusion 24 is a portion to be cut later by using a general mechanical processing method, e.g., a trimming operation. In a general trimming operation, the protrusion 24 is cut by arranging a die formed of a metal, for example, on the protrusion 24 and applying a pressure thereto. However, in the mold structure for the LED package 20, according to an embodiment of the present invention, the notch 22, which is a region for inserting a trimming die thereto, is formed at the bottom of the protrusion 24 to minimize the amount of remaining protrusion 24 after a trimming operation.

Figure 3:
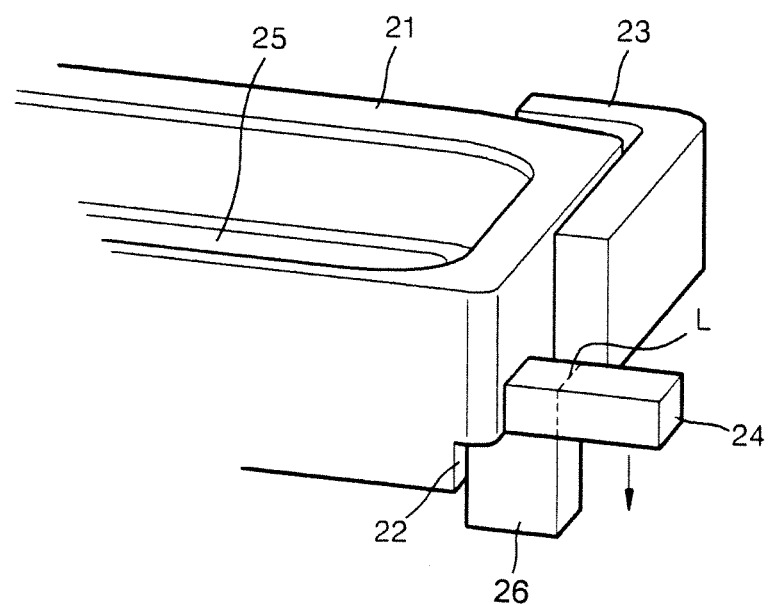
FIG. 3 shows that a trimming die is inserted to the rear of the mold structure for the LED package, according to an embodiment of the present invention, and a metal end is cut.

FIG. 3 shows that a trimming die 26 is inserted to the rear of the mold structure for the LED package 20, according to an embodiment of the present invention, and a metal end is cut. Referring to FIG. 3, the trimming die 26 is inserted to the notch 22 at the bottom of the protrusion 24, and, after the trimming die 26 is fixed, cutting of an L-shaped portion is induced by applying a pressure to the protrusion 24 in the direction indicated by the arrow.

Here, although the protrusion 24 is slightly exaggerated in FIG. 2A, the protruding height of the protrusion 24 after inserting the trimming die 26 to the notch 22 and cutting the protrusion 24 may be less than the width of the electrode lead 23. Generally, a trimming die used for a trimming operation has a width above 0.4 mm, and it is necessary to design a mold structure for a LED package to have a width of at least one surface greater than 0.4 mm due to the remaining protrusion. However, according to an embodiment of the present invention, a size of a mold structure for a LED package may be reduced as much as the size of a trimming die by forming the notch 22, to which the trimming die may be inserted, in the package mold 21. In detail, the protruding height of the protrusion 24 may be equal to or above 0 mm and below or equal to 0.4 mm. Furthermore, the amount of a material for forming the package mold 21 corresponding to volume of the notch 22 may be saved.

The notch 22 may be formed at a region at the opposite side of the cavity 25 to which a LED of the package mold 21 is mounted, and, in an actual process for forming a mold structure for a LED package, the notch 22 may be formed in a region to correspond to a location at which a protrusion is to be formed.

Referring back to FIGS. 2A and 2B, in the mold structure for the LED package 20, according to an embodiment of the present invention, the electrode lead 23 for supplying power to a LED package may be formed to have a bent structure that is very close to the package mold 21. Therefore, a size of a LED package may be minimized by eliminating the region A for bending the electrode lead 14, as shown in FIG. 1A.

Figure 4A:
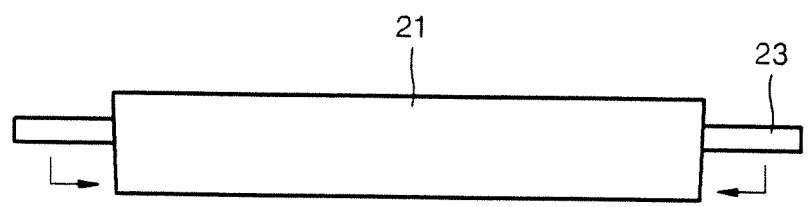
FIGS. 4A and 4B show a process for bending an electrode lead of a mold structure for a LED package, according to an embodiment of the present invention.
Figure 4B:
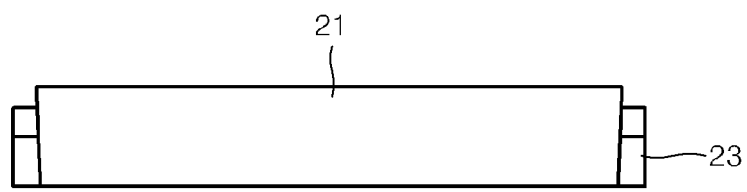

FIGS. 4A and 4B show a process for bending an electrode lead of a mold structure for a LED package, according to an embodiment of the present invention. Referring to FIGS. 4A and 4B, during fabrication of the package mold 21, the electrode lead 23 is formed to substantially protrude from two opposite sides of the package mold 21. To form the structure as shown in FIG. 4B, the package mold 21 is fixed, and the electrode lead 23 is bent downward. In other words, unlike in the related art, the electrode lead 23 is bent directly on the package mold 21 without using a separate bending die. The electrode lead 23 may be formed of a generally used copper material. Since the thickness of the electrode lead 23 is sufficiently small, the package mold 21 may withstand bending stress while the electrode lead 23 is being bent. Since a bending die generally used for bending the electrode lead 23 has a width above 0.4 mm, the width of a package mold is increased as much as the width of the bending die. However, in the case of the mold structure for the LED package 20, according to an embodiment of the present invention, a gap between the electrode lead 23 and the package mold 21 may be formed to be from 0 mm to 0.4 mm, and thus, the overall size of the LED package 20 may be reduced.

Figure 5:
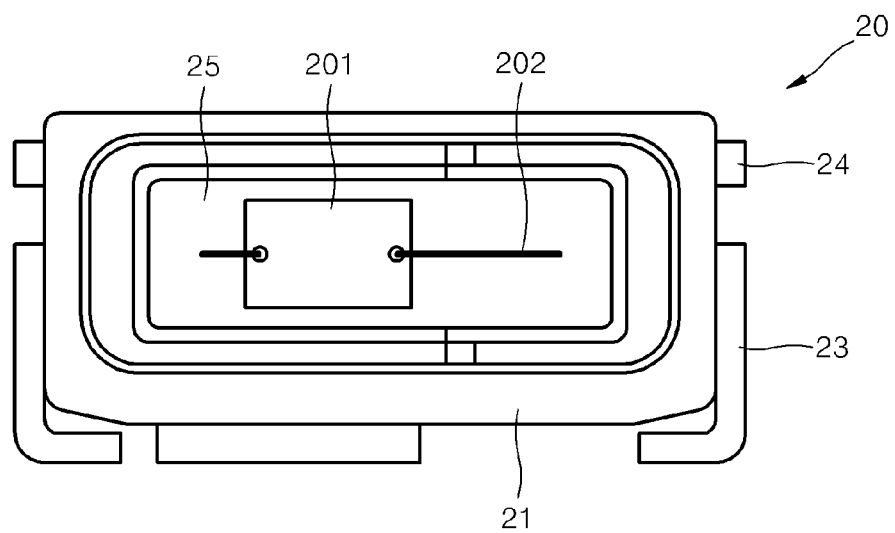
FIG. 5 is a diagram showing that a LED is mounted to a mold structure for a LED package according to an embodiment of the present invention.

FIG. 5 is a diagram showing that a LED 201 is mounted to a mold structure for a LED package according to an embodiment of the present invention. Referring to FIG. 5, the LED 201 is mounted in a cavity 25 of the package mold 21, and power is supplied to the LED 201 from outside of the LED package via a bonding wire 202.

Protrusions 24 remain at two opposite sides of the package mold 21, and, although not shown in FIG. 5, the notches 22 are formed at the bottom of the protrusions 24, as shown in FIGS. 2A and 2B. Furthermore, the electrode lead 23 is formed to contact at least a side of the package mold 21.

A mold structure for a LED package, according to an embodiment of the present invention, may be a mold structure for a surface mount device (SMD) type LED package. In a SMD type LED package, the dimensions of a LED package, such as width, thickness, etc., significantly affect the performance of a display device employing the SMD type LED package. Therefore, the overall performance of a display device employing a SMD type LED package may be improved by forming the notch 22 in the package mold 21 and forming the electrode lead 23 to be closely attached to the package mold 21.

In the above embodiments, a portion of a metal member protruding from a mold structure for a LED package may be minimized by forming a notch on the rear surface of the mold structure for a LED package for arranging a trimming die therein, and thus, a size of a LED package may be minimized.

Furthermore, the size of a LED package may be minimized by forming electrode leads to be closely attached to a mold structure for a LED package.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A mold structure for a light-emitting diode (LED) package, the mold structure comprising:
   a package mold, having a cavity in which a LED is mounted;
   a notch disposed at at least an end portion of the package mold, and
   an electrode lead disposed at at least an end portion of the package mold, the electrode lead being spaced apart from the notch,
   the mold structure further comprising a protrusion, which is disposed at a location corresponding to the notch,
   wherein the protruding height of the protrusion is less than 0.4 mm.

2. The mold structure of claim 1, wherein the notch is disposed at a region at the opposite side of the cavity to which the LED of the package mold is mounted.

3. The mold structure of claim 1, wherein the notch is a region to which a trimming die is inserted.

4. The mold structure of claim 1, wherein a gap between the package mold and the electrode lead is narrower than 0.4 mm.

5. The mold structure of claim 1, wherein the mold structure for a LED package is a mold structure for a surface mount device (SMD) type LED package.

6. The mold structure of claim 1, wherein the electrode lead has a bent structure extending along surfaces of the package mold with a gap narrower than 0.4 mm between the surfaces of the package mold and the electrode lead.

\* \* \* \* \*